(12) United States Patent
Kim

(10) Patent No.: US 7,223,663 B2
(45) Date of Patent: May 29, 2007

(54) MOS TRANSISTORS AND METHODS OF MANUFACTURING THE SAME

(75) Inventor: Hak-Dong Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 44 days.

(21) Appl. No.: 11/022,611

(22) Filed: Dec. 27, 2004

(65) Prior Publication Data

US 2005/0139875 A1    Jun. 30, 2005

(30) Foreign Application Priority Data

Dec. 27, 2003   (KR) .................. 10-2003-0098385

(51) Int. Cl.
*H01L 21/336* (2006.01)
*H01L 21/8238* (2006.01)

(52) U.S. Cl. .............. 438/302; 438/301; 438/199; 438/197; 438/299; 438/303; 438/217; 438/306; 438/305; 438/514; 438/527; 257/E21.336; 257/E21.337; 257/E21.342

(58) Field of Classification Search ............ 438/276, 438/299, 197, 199, 302, 301, 303, 306, 305, 438/510, 514, 527; 257/E21.336, E21.337, 257/E21.342
See application file for complete search history.

(56) References Cited

U.S. PATENT DOCUMENTS 6,114,211 A * 9/2000 Fulford et al. ............. 438/305
6,174,778 B1   1/2001 Chen et al.
6,521,502 B1   2/2003 Yu
2001/0018255 A1 * 8/2001 Kim et al. ................. 438/305

FOREIGN PATENT DOCUMENTS

JP        02-044734       2/1990

* cited by examiner

*Primary Examiner*—Walter L. Lindsay, Jr.
(74) *Attorney, Agent, or Firm*—Andrew D. Fortney

(57) ABSTRACT

MOS transistors having a low junction capacitance between their halo regions and their source/drain extension regions and methods for manufacturing the same are disclosed. A disclosed MOS transistor includes: a semiconductor substrate of a first conductivity type; a gate insulating layer pattern and a gate on an active region of the substrate; spacers on side walls of the gate; source/drain extension regions of a second conductivity type within the substrate on opposite sides of the gate, the source/drain extension regions having a graded junction structure; halo impurity regions of the first conductivity type within the substrate under opposite edges of the gate adjacent respective ones of the source/drain extension regions; and source/drain regions of the second conductivity type within the substrate on opposite sides of the spacer.

11 Claims, 5 Drawing Sheets

MOS TRANSISTORS AND METHODS OF MANUFACTURING THE SAME

FIELD OF THE DISCLOSURE

The present disclosure relates generally to semiconductor fabrication, and more particularly, to MOS transistors and methods of manufacturing the same.

BACKGROUND

FIGS. 1A to 1E are cross sectional views illustrating a prior art method of manufacturing a conventional MOS transistor. Referring to FIG. 1A, an active region where a MOS transistor is to be formed is defined by forming isolation layers 110 in a p-type semiconductor substrate 100. Next, a gate insulating pattern 120 and a gate 130 are sequentially formed on the active region of the substrate 100. The active region under the gate 130 serves as a channel region.

Referring to FIG. 1B, in order to reduce the short channel effect, a first ion implanting process is performed to form halo impurity regions 141 in a vicinity of the channel region under the gate 130. The halo impurity regions 141 are formed in the first ion implanting process by implanting p-type impurities in a tilted direction (the directions of the arrows in FIG. 1B) with respect to the substrate 100.

Referring to FIG. 1C, a second ion implanting process is performed to form source/drain extension regions 142, (i.e., lightly doped drain (LDD) regions) within the substrate 100 on opposite sides of the gate 130. The second ion implanting process is performed by implanting lightly doped n-type impurities in a vertical direction (the direction of the arrows in FIG. 1C) with respect to the substrate 100. In some cases, the second ion implanting process may be performed prior to the first ion implanting process. In addition, although not shown in the figure, an oxide layer may be formed as an ion implanting buffer layer on the surface of the substrate 100 prior to the second ion implanting process.

Referring to FIG. 1D, gate spacers 150 are formed on opposite side walls of the gate 130. Next, a third ion implanting process is performed to form source/drain regions 143 within the substrate 100 at opposite sides of the spacers 150 by implanting heavily doped n-type impurities in the vertical direction (the direction of the arrows in FIG. 1D) with respect to the substrate 100.

Referring to FIG. 1E, a silicide process is then performed to form metal silicide layers 160 on the source/drain regions 143 and the gate 130.

In a conventional MOS transistor, (e.g., a transistor used as a logic device), the junction capacitance between the halo impurity regions 141 and the source/drain extension regions 142 reduces the switching speed. However, the junction capacitance cannot be completely removed due to the structural characteristics of the device. Therefore, there is a demand for reducing the junction capacitance as much as possible.

DETAILED DESCRIPTION

Figure 1A:
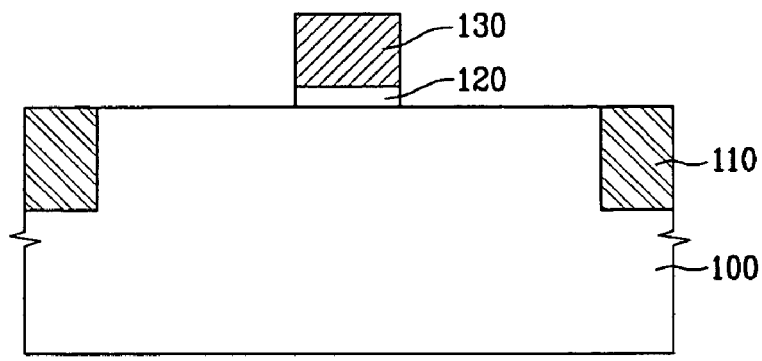
FIGS. 1A to 1E are cross sectional views illustrating a prior art method of manufacturing a conventional MOS transistor.
Figure 1B:
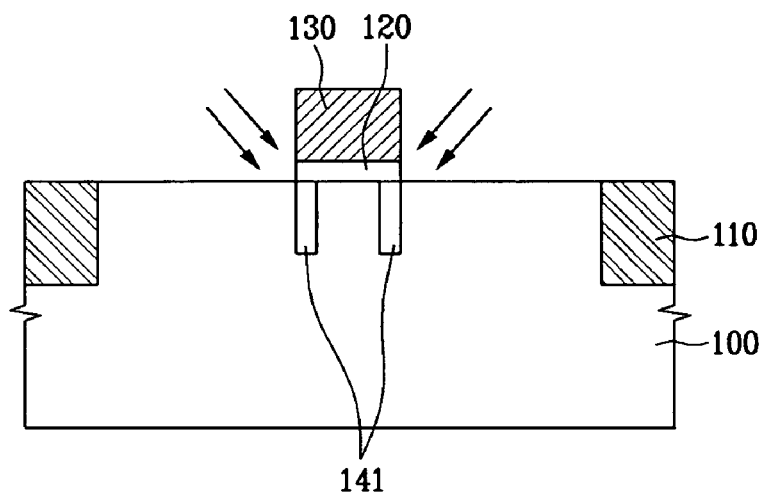
Figure 1C:
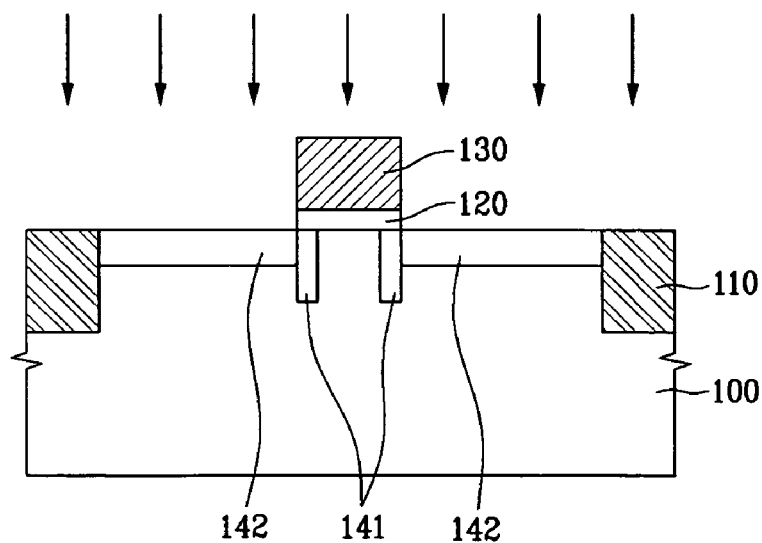
Figure 1D:
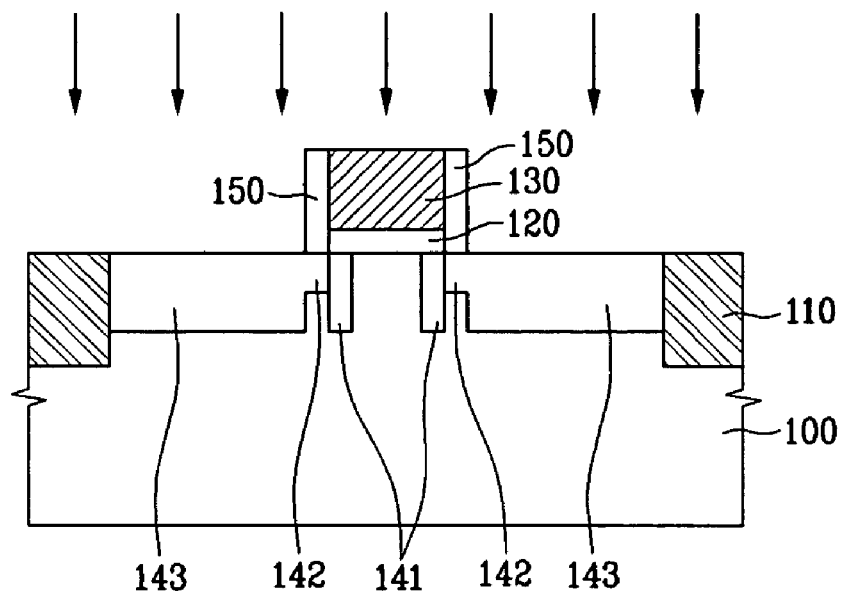
Figure 1E:
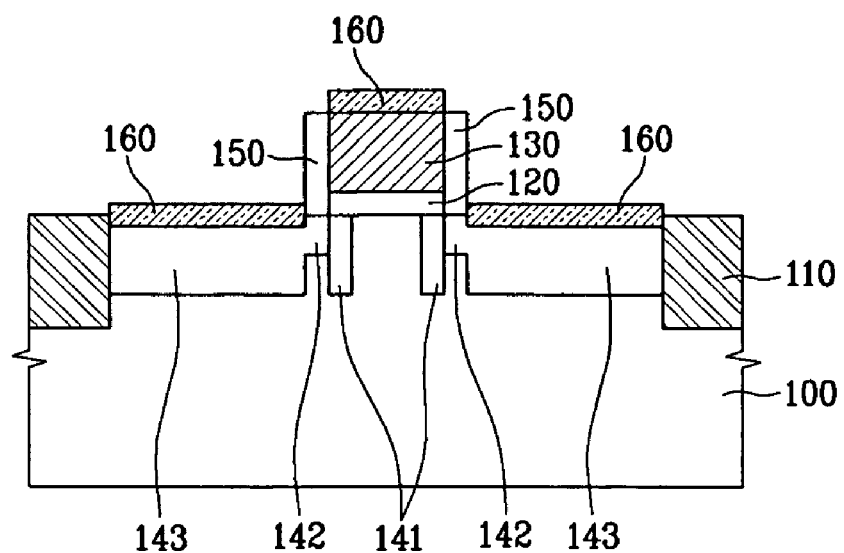
Figure 2A:
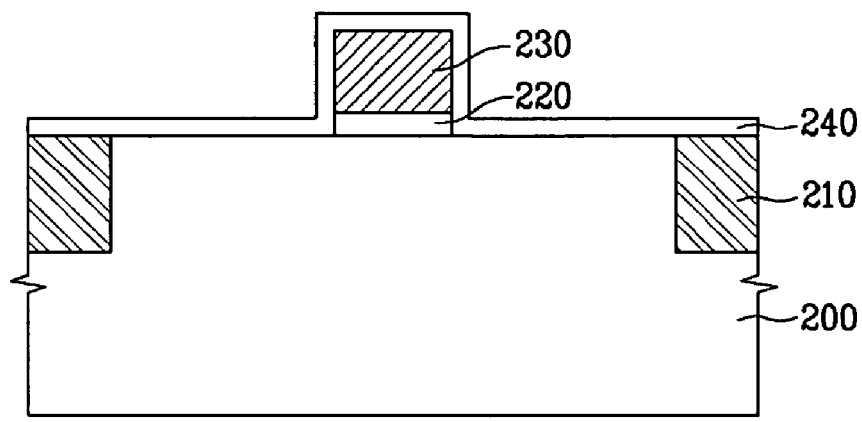
FIGS. 2A to 2E are cross sectional views illustrating a method of manufacturing a MOS transistor performed in accordance with the teachings of the present invention.

An example MOS transistor constructed in accordance with the teachings of the present invention will now be described with reference to FIG. 2E. Referring to FIG. 2E, a gate insulating layer pattern 220 and a gate 230 are sequentially formed on an active region of a p-type semiconductor substrate 200. The active region is defined in the substrate 200 by isolation layers 210. Gate spacers 260 are formed on side walls of the gate 230. The active region under the gate 230 serves as a channel region. First, n-type, source/drain extension regions 251, (i.e., first LDD regions) are formed within the substrate 200 on opposite sides of the gate 230. Second, n-type, source/drain extension regions 252, (i.e., second LDD regions) having a higher impurity concentration than the first source/drain extension regions 251 are formed under the first source/drain extension regions 251. P-type halo impurity regions 253 are formed within the substrate 220 under respective edges of the gate 230, (i.e., at the edges of the channel region) adjacent the second source/drain extension regions 252. N-type source/drain regions 254 are formed within the substrate 200 on opposite sides of the spacers 260.

In the illustrated example, a buffer oxide layer 240 is formed between the gate 230 and the spacers 260.

As described above, each of the source/drain extension regions has a combined structure including the first and second source/drain extension regions 251, 252. Thus, each of the source/drain extension regions has a graded junction structure, since the impurity concentrations of the first and second source/drain extension regions 251, 252 are different from each other. Therefore, it is possible to reduce the junction capacitance between the halo impurity regions 253 and the source/drain extension regions 251, 252.

Next, an example method of manufacturing the above described MOS transistor will be described with reference to FIGS. 2A to 2E. Referring to FIG. 2A, a gate insulating layer pattern 220 and a gate conductive layer 230 are sequentially formed on an active region of a p-type semiconductor substrate 200. The active region is defined in the substrate 200 by isolation layers 210. The portion of the active region located under the gate 230 serves as a channel region. In the illustrated example, the gate insulating layer pattern 220 is formed of an oxide layer and the gate 230 is formed of a polysilicon layer.

Next, an ion implanting buffer layer 240 is formed on the entire surface of the substrate 200. In the illustrated example, the ion implanting buffer layer 240 is formed of an oxide layer.

Figure 2B:
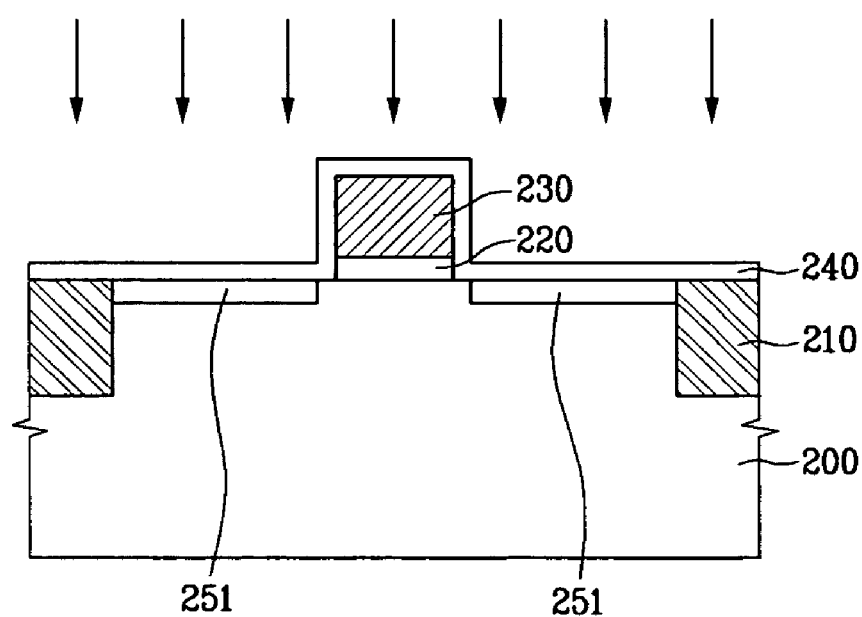

Referring to FIG. 2B, a first ion implanting process is performed to form first source/drain extension regions 251 within the substrate 200 on opposite sides of the gate 230. The first ion implanting process is performed by implanting lightly doped n-type first impurities in a substantially vertical direction with respect to the substrate 200 (i.e., in the direction of the arrows in FIG. 2B). In the illustrated example, the first ion implanting process is performed at an implanting energy of about 5 to 50 keV and a concentration of about $1 \times 10^{14}$ to $1 \times 10^{15}$ ions/cm$^2$ using arsenic (As) ions as the first impurities.

Figure 2C:
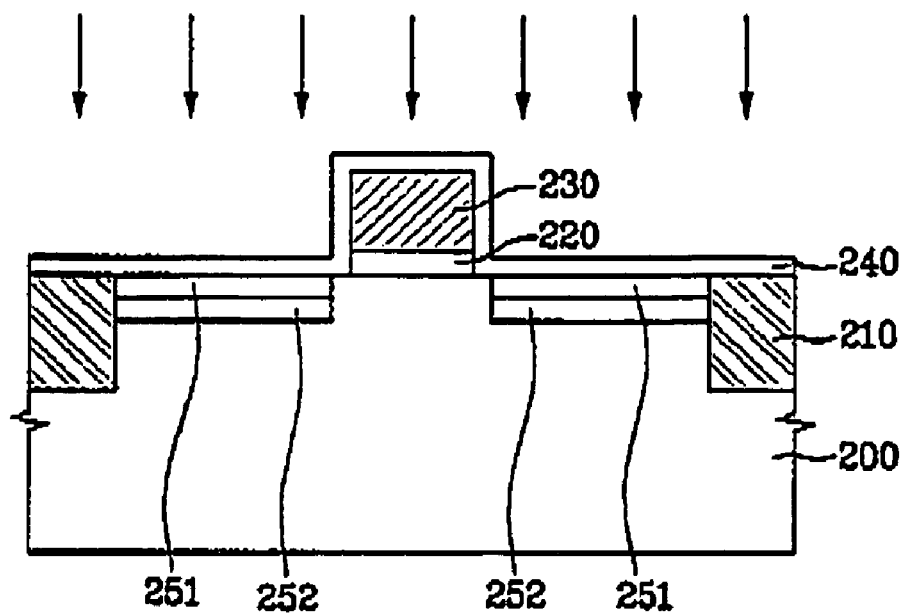

Referring to FIG. 2C, a second ion impurity process is performed to form second source/drain extension regions 252 under the first source/drain extension regions 251. The second ion impurity process is performed by implanting n-type second impurities having a higher impurity concentration than the first impurities in a substantially vertical direction with respect to the substrate 200 (i.e., in the direction of the arrows in FIG. 2C). The second ion implanting process is performed at an implanting energy of about 10 to 50 keV and a concentration of about $5\times10^3$ to $5\times10^{14}$ ions/cm$^2$ using phosphorus (P) ions as the second impurities.

Figure 2D:
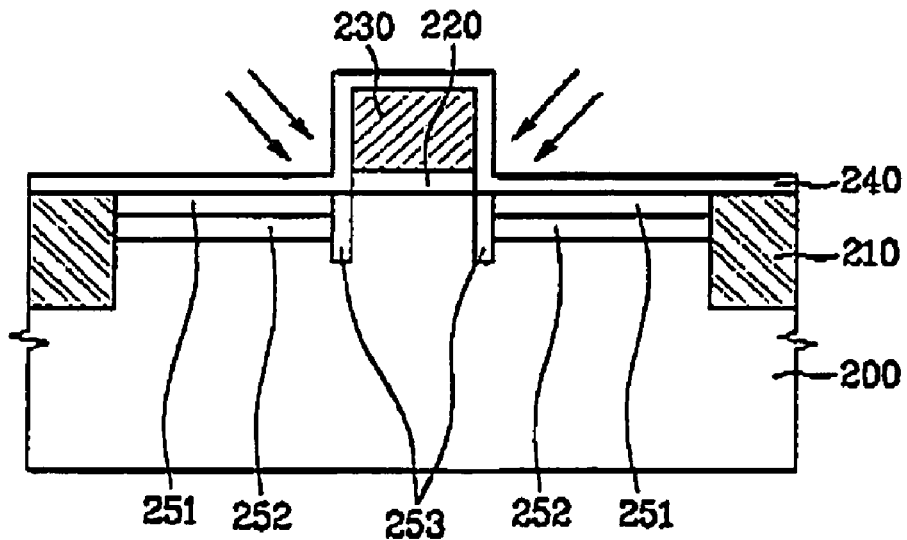
Figure 2E:
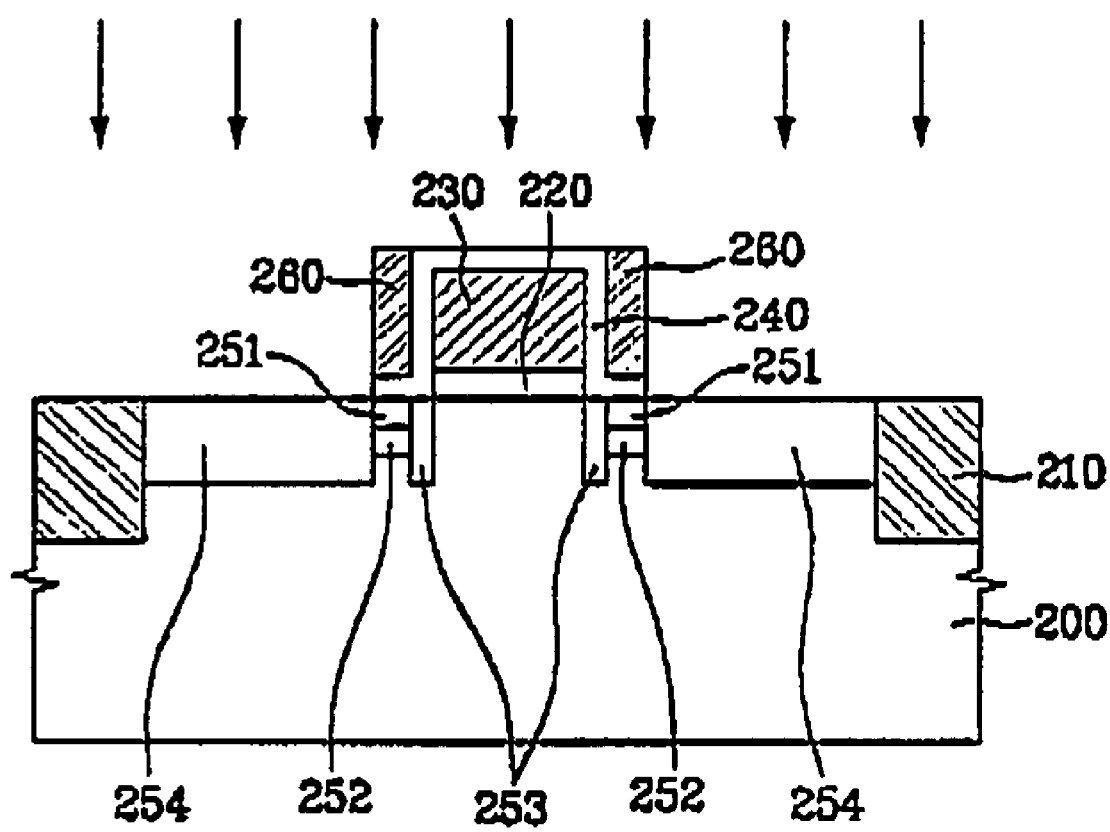

Referring to FIG. 2D, a third ion implanting process is performed to form halo impurity regions 253 within the substrate 200 under the edges of the gate 230. The third ion implanting process is performed by implanting p-type third impurities in a tilted direction with respect to the substrate 200 (i.e., in the direction of the arrows in FIG. 2D). In the illustrated example, the third ion implanting process is performed at an implanting energy of about 5 to 50 keV and a concentration of about $1\times10^{14}$ to $5\times10^{15}$ ions/cm$^2$ using $BF_2$ ions as the third impurities. In the illustrated example, the third ion implanting process is performed at a tilt angle of about 20 to 30 degree.

Next, the first, second, and third impurities are diffused by performing a first thermal treatment process. In the illustrated example, the first thermal treatment process is performed at a temperature of about 800 to 1000° C. in an $N_2$ ambience for about 10 to 30 seconds by a rapid thermal process (RTP).

Referring to FIG. 2E, gate spacers 260 are formed on the ion implanting buffer layer 240 at side walls of the gate 230. The gate spacers 260 of the illustrated example are formed by depositing a spacer insulating layer such as a nitride layer on the entire surface of the substrate 200 and etching the spacer insulating layer with an anisotropic etching method such as an etch-back method.

Next, a fourth ion implanting process and a second thermal treatment process are performed to form source/drain regions 254 within the substrate 200 on opposite sides of the gate spacer 260. The fourth ion implanting process is performed by implanting heavily doped n-type fourth impurities in a substantially vertical direction with respect to the substrate 200 (i.e., in the direction of the arrows in FIG. 2E). In the illustrated example, the second thermal treatment process is performed at a temperature of about 900 to 1050° C. in an $N_2$ ambience for about 10 to 30 seconds by an RTP.

As described above, the source/drain extension regions 251, 252 have a combined structure of first source/drain extension regions 251 and second source/drain extension regions 252. The second source/drain extension regions 252 have a higher impurity concentration than the first source/drain extension regions 251. Thus, the combined structure of the first and second source/drain regions 251, 252 forms a graded junction structure where the impurity concentrations are different in different areas of the structure. As a result, the junction capacitance between the halo impurity regions 253 and the source/drain extension regions 251, 252 is reduced, and the switching speed of the device can, thus, be increased.

Persons of ordinary skill in the art will readily appreciate that, although the n-channel MOS transistor is described above, the methods disclosed herein can easily be adapted to fabricate a p-channel MOS transistor.

From the foregoing, persons of ordinary skill in the art will readily appreciate that MOS transistors having low junction capacitance between the halo regions 253 and the source/drain extension regions 251, 252 have been disclosed. Methods of manufacturing such MOS transistors have also been disclosed.

A disclosed example MOS transistor comprises: a semiconductor substrate of a first conductivity type; a gate insulating layer pattern and a gate on an active region of the substrate; spacers on side walls of the gate; source/drain extension regions of a second conductivity type formed within the substrate on opposite sides of the gate, the source/drain extension regions having a graded junction structure; halo impurity regions of the first conductivity type formed within the substrate under edges of the gate so as to surround the source/drain extension regions; and source/drain regions of the second conductivity type formed within the substrate on opposite sides of the spacers.

A disclosed example method of manufacturing a MOS transistor comprises: forming a gate insulating layer pattern and a gate on an active region of a semiconductor substrate of a first conductivity type; forming first source/drain extension regions of a second conductivity type within the substrate on opposite sides of the gate by performing a first ion implanting process; forming second source/drain extension regions of the second conductivity type within the substrate under the first source/drain extension regions by performing a second ion implanting process; forming halo impurity regions of the first conductivity type within the substrate under edges of the gate by performing a third ion implanting process; forming spacers on side walls of the gate; and forming source/drain regions of the second conductivity type within the substrate on opposite sides of the spacers by performing a fourth ion implanting process.

It is noted that this patent claims priority from Korean Patent Application Serial Number 10-2003-0098385, which was filed on Dec. 27, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of manufacturing a MOS transistor, comprising steps of:
   forming a gate insulating layer pattern and a gate on a semiconductor substrate of a first conductivity type where an active region is defined by an isolation layer;
   forming an ion implanting buffer layer on the entire surface of the substrate;
   forming first source/drain extension regions of a second conductivity type first within the substrate at both sides of the gate by performing a first ion implanting process;
   forming second source/drain extension regions of the second conductivity type within the substrate under the first source/drain extension region by performing a second ion implanting process;
   forming halo impurity regions of the first conductivity type within the substrate under the edge of the gate by performing a third ion implanting process;
   forming a spacer on side walls of the gate; and
   forming source/drain regions of the second conductivity type within the substrate at both sides of the spacer by performing a fourth ion implanting process.

2. A method of claim 1, wherein the second source/drain extension regions have a higher impurity concentration than the first source/drain extension regions.

3. A method of claim 1, wherein the first conductivity type is p-type and the second conductivity type is n-type.

4. A method of claim 3, wherein the first Ion implanting process is performed at an implanting energy of about 5 to 50 keV and a concentration of about $1\times10^{14}$ to $1\times10^{15}$ ions/cm$^2$ using arsenic (As) ions.

5. A method of claim 4, wherein the second ion implanting process is performed at an implanting energy of about 10 to 50 keV and a concentration of about $5\times10^{13}$ to $5\times10^{14}$ ions/cm$^2$ using phosphorus (P) ions.

6. A method of claim 3, wherein the third ion implanting process is performed in a tilted direction with respect to the substrate.

7. A method as defined in claim 6, wherein the third ion implanting process is performed at an implanting energy of about 5 to 50 keV and a concentration of about $1\times10^{14}$ to $5\times10^{15}$ ions/cm$^2$ using BF$_2$ ions.

8. A method of claim 7, wherein the third ion implanting process is performed at a tilt angle of 20 to 30 degrees.

9. A method of claim 1, wherein the ion implanting buffer layer comprises an oxide layer.

10. A method of claim 1, wherein the first conductivity type is n-type and the second conductivity type is p-type.

11. A method of manufacturing a MOS transistor, comprising steps of:

forming a gate insulating layer pattern and a gate on a p-type semiconductor substrate where an active region is defined by an isolation layer;

forming first n-type source/drain extension regions within the substrate at sides of the gate by performing a first ion implanting process;

forming second n-type source/drain extension regions within the substrate under the first source/drain extension regions by performing a second ion implanting process;

forming halo impurity regions of the first conductivity type within the substrate under the edge of the gate by performing a third ion implanting process, wherein the third ion implanting process is performed in a tilted direction with respect to the substrate and at an implanting energy of about 5 to 50 keV and a concentration of about $1\times10^{14}$ to $5\times10^{15}$ ions/cm$^2$ using BF$_2$ ions;

forming a spacer on side walls of the gate; and forming n-type source/drain regions within the substrate at sides of the spacer by performing a fourth ion implanting process.

* * * * *